United States Patent [19]
McNeil et al.

[11] Patent Number: 6,035,523
[45] Date of Patent: Mar. 14, 2000

[54] METHOD AND APPARATUS FOR SUPPORTING A COMPONENT ON A SUBSTRATE

[75] Inventors: Greg D. McNeil, Boulder Creek; David C. Buuck, Santa Clara; Alan D. Foster, Los Altos, all of Calif.

[73] Assignee: Apple Computer, Inc., Cupertino, Calif.

[21] Appl. No.: 08/491,186

[22] Filed: Jun. 16, 1995

[51] Int. Cl.⁷ ...................................................... H05K 3/30
[52] U.S. Cl. ............................. 29/832; 29/840; 257/718; 257/719; 437/902
[58] Field of Search .................................. 257/718, 719, 257/707; 437/902, 211

[56] References Cited

U.S. PATENT DOCUMENTS

| | | | |
|---|---|---|---|
| 3,649,738 | 3/1972 | Anderson et al. | 257/719 X |
| 4,521,829 | 6/1985 | Wessely | 257/719 X |
| 5,107,330 | 4/1992 | Dahringer | 257/718 |
| 5,184,211 | 2/1993 | Fox | 257/718 X |
| 5,359,768 | 11/1994 | Haley | 29/840 |

FOREIGN PATENT DOCUMENTS

| | | | |
|---|---|---|---|
| 89/08327 | 9/1989 | WIPO | 437/902 |
| 94/29901 | 12/1994 | WIPO | 257/718 |

OTHER PUBLICATIONS

IBM Tech Discl. Bull vol. 33 No. 2 pp 218–219, Jul. 1990.
IBM Tech Discl Bull vol. 33 No. 5 pp 246–252, Oct. 1990.

*Primary Examiner*—Carl J. Arbes
*Attorney, Agent, or Firm*—David J. Larwood

[57] ABSTRACT

A support is provided for a component on a substrate to minimize unacceptable bending or displacement. In a preferred embodiment, a suitable amount of a thermoplastic material is injected through a hole in a PCB under the component after the component has been affixed to the PCB. This allows the support material to fill any space between the component and the PCB yet allow for variation in lead height and for thermal expansion of the support material.

3 Claims, 3 Drawing Sheets

FIGURE 6
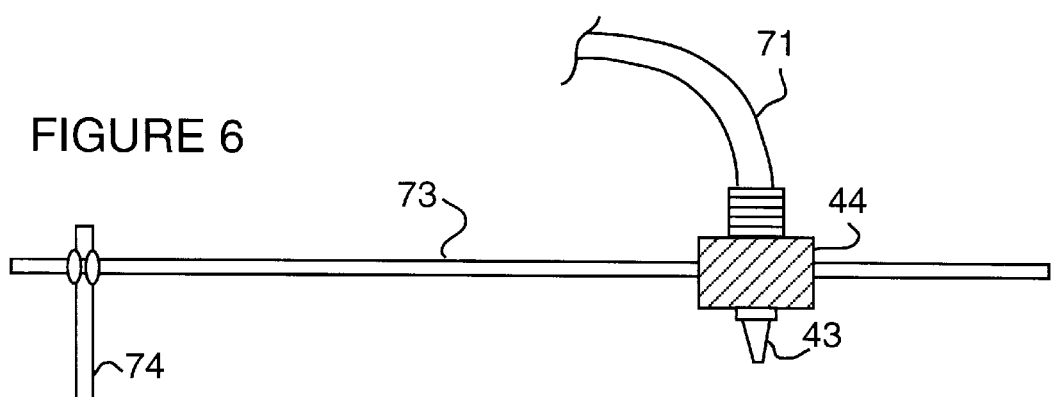
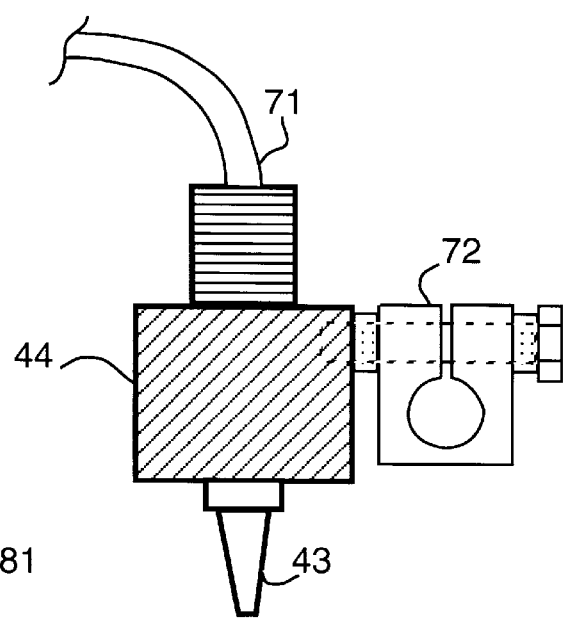
FIGURE 7
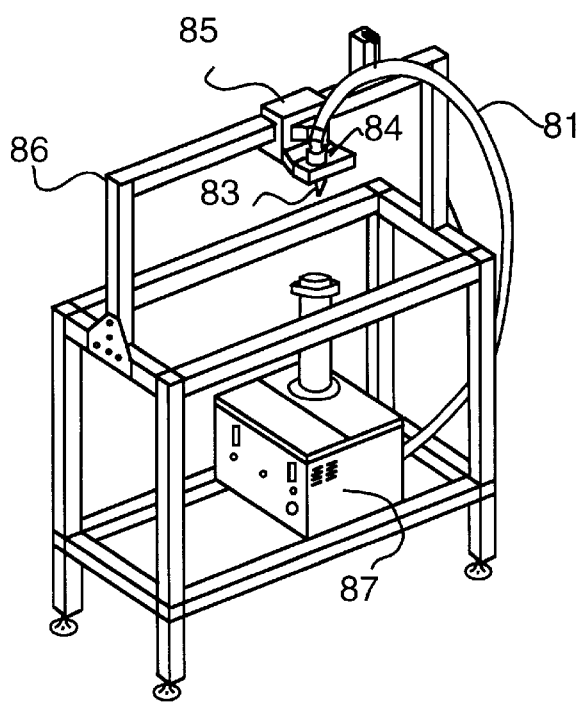
FIGURE 8

METHOD AND APPARATUS FOR SUPPORTING A COMPONENT ON A SUBSTRATE

FIELD OF THE INVENTION

This invention relates to the field of securing a device to a substrate where part of the device is and part of the device is not in contact with the substrate. More particularly, this invention relates to securing an electronic device such as an integrated circuit package to a printed circuit board and providing support for the center portion of the package without relying on the leads, which are in contact with the PCB.

BACKGROUND OF THE INVENTION

In the field of electronics, it is quite common to secure a component such as an integrated circuit (IC), to a substrate such as a printed circuit board (PCB). In a typical application, the IC is in a package with leads along two or more edges. These leads are connected to a PCB in a variety or ways, typically by soldering. With larger components with higher lead counts, many packages have leads along all four edges.

If such a component is stressed by applying a force on the component orthogonal to the plane of the substrate, if the force is applied in the vicinity of the leads, the leads provide good mechanical resistance to the force (within limits, of course, beyond which the leads may fail and collapse). However, if the force is applied to a region of the component which is not close to the leads, there may be a considerable lever arm between the region of the component which is supported (near the leads) and the point at which the force is applied. These principles apply equally well to a force which has a component orthogonal to the plane of the substrate. Referring to FIG. 1, if the span between support points (e.g. leads 10) is significant, a component 11 may be displaced a significant amount when resisting an external force 12 such as a shock.

A traditional package for an IC may be mechanically rigid and transfer force efficiently from where it is applied to a fulcrum, such as the leads. Some newer packaging, particularly C4-QFP (controlled collapse chip carrier-quad flat package) packages, are not as rigid mechanically. In fact, for a PowerPC processor (Motorola, Phoenix, Ariz., or IBM, Essex Junction, Vt.) such as a PowerPC 601 or PowerPC 604, the package dimensions are approximately 1.8 inches by 1.8 inches between edges and leads. Referring to FIG. 2, package 21 is secured to PCB 22 by leads 23. Integrated circuit die 24 is affixed to the top of package 21. Heatsink 25 is positioned firmly over die 24 by holder 26, which is secured in turn by clips 27 which are pushed through and lock under holes 28 in PCB 22. Die 24 and heatsink 25 preferably are thermally connected by a thermal grease such as TC208 (available from Thermoset) or TC228 (especially for PowerPC 604) or the like. This helps conduct heat from die 24 to heatsink 25.

In a typical manufacturing process, a component such as a PowerPC IC is positioned on and secured to a circuit board. In a subsequent step, a heatsink is positioned over the component, then secured by a holder. During the positioning and securing of the heatsink, it is very easy to apply a force at or near the center of the component, orthogonal to the PCB, and bend the component. In some packages, especially C4 QFP, the die is exposed and has no mechanical protection against deformation other than that provided by the component package. In a significant number of instances, the deformation exceeds allowable limits and the die cracks, rending the component non-functional. This, in turn, makes the PCB useless and the component must be replaced. In a typical manufacturing operation, well over 20% of the board failures can be traced to a cracked die. Furthermore, once a board is shipped, the heat sink is a prominent feature on the PCB and can be accidentally or deliberately engaged. In some instances, inexperienced personnel pick up a PCB only by the heat sink, thus applying a significant force as the board tends to rotate at an angle to the heat sink, applying a potentially damaging force to the IC and the die. A substantial portion of field failures of the board are also due to cracked die.

A component such as a PowerPC IC may also be damaged through inadvertently pressing on the die through other actions. Die cracking was observed as a result of poor handling practices and inability to follow rigid guidelines for attaching and handling heatsinks. Some specific problems were:

1. Twisting or flexing the PCB.
2. Stacking populated boards.
3. Carelessness when placing assembled boards in totes or boxes.
4. Resting the top side of the board on a hard surface damages microprocessor die.
5. Using too much pressure to apply heatsink.
6. Using uneven pressure to apply heatsink.
7. Pushing down on a correctly attached heatsink.
8. Not using the correct heatsink placement tool.
9. Leaving heatsink loose by not engaging all four heatsink clips into the board.
10. Using the heatsink as a handle to pick up and move the populated board.

Prior to this invention, there has not been a useful solution to this problem. Over 1.3 million PowerPC computers have been shipped by Apple Computer alone and more PowerPC computers have been shipped by other vendors. This potential problem is common to many if not all, of these computers.

This type of problem may exist for other components as well. In general, this is less of a problem where the span between leads is relatively small. Also, the problem is minimized where the packaging is particularly rigid. However, whenever a component includes a brittle sub-component, such as a silicon die, that may flex beyond tolerable limits under certain conditions, the present invention may provide a benefit. The problem is likely to be exacerbated for a component with widely spaced leads (e.g. edge-to-edge across a component) with no central or intermediate support.

SUMMARY OF THE INVENTION

The present invention provides a support for a component which otherwise may be subject to unacceptable bending or displacement. In a preferred embodiment, a suitable amount of a thermoplastic material is injected through a hole in a PCB under the component after the component has been affixed to the PCB. This allows the support material to fill any space between the component and the PCB yet allow for variation in lead height and for thermal expansion of the support material, as explained more fully below.

One object of the present invention is to provide a support for a component to minimize flexing under an imposed load.

This and other objects and advantages of the invention, as well as the details of an illustrative embodiment, will be more fully understood from the following specification and drawings.

BRIEF DESCRIPTION OF THE DRAWINGS

FIG. 6 illustrates one preferred support mechanism for the nozzle shown in FIG. 4.

FIG. 7 illustrates a detail of mounting the nozzle of FIG. 6.

FIG. 8 illustrates an alternative, preferred support mechanism for the nozzle shown in FIG. 4.

DESCRIPTION OF THE PREFERRED EMBODIMENTS

The present invention is directed to providing a suitable support to stabilize and support a component on a substrate so the component can better resist certain forces imposed on the component. More particularly, the invention is directed to providing a support for an integrated circuit (IC) or chip carrier on a printed circuit board (PCB). The preferred material is thermoplastic and preferably is inserted after the component has been secured to the PCB. However, a range of variations on this technique will be understood and appreciated by one skilled in the art.

Figure 1:
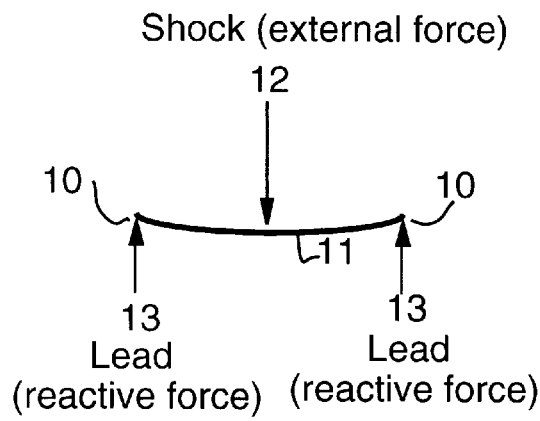
FIG. 1 illustrates the deformation of a component under stress from an external force and reactive forces where there is no reactive force in a portion of the component.
Figure 2:
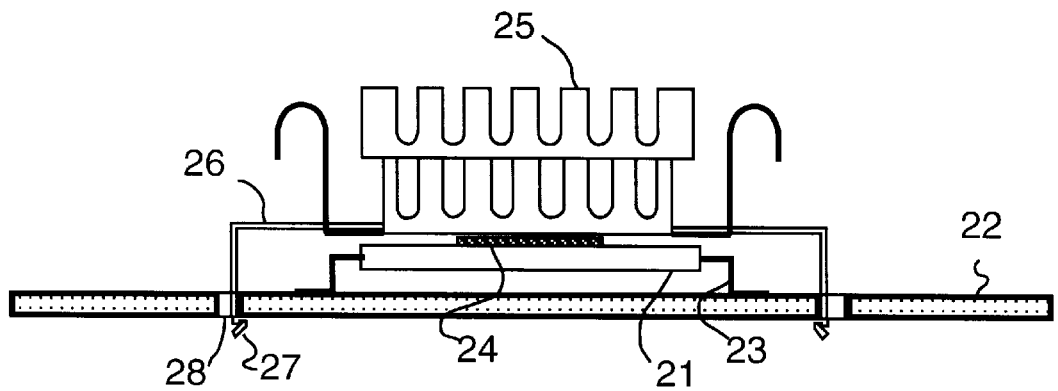
FIG. 2 illustrates a component secured to a PCB with a heatsink secured to the PCB and to the component.
Figure 3:
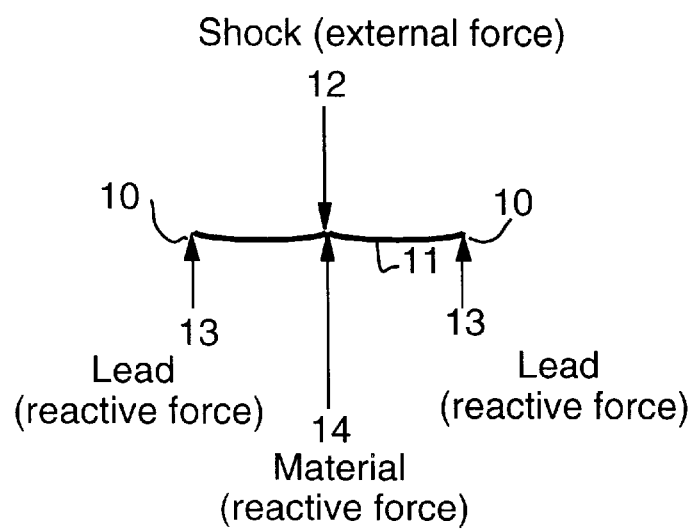
FIG. 3 illustrates the deformation of a component under stress as in FIG. 1 but where there is a reactive force from a central support.

Referring to FIG. 3, providing a material at some point between leads 10 adds a third reactive force 14 to the reactive forces of the leads described above in relation to FIG. 1. One skilled in the art will recognize that the amount of material added will affect the amount of reactive force. In general, it is preferable to add the material approximately at the center of the span between leads 10. It is particularly preferable to fill a volume to provide material under approximately 5 to 20% of the linear distance between the leads. The specific amount filled is not critical, but one preferred target amount is about 15%±5% of the linear distance between the leads.

Figure 4:
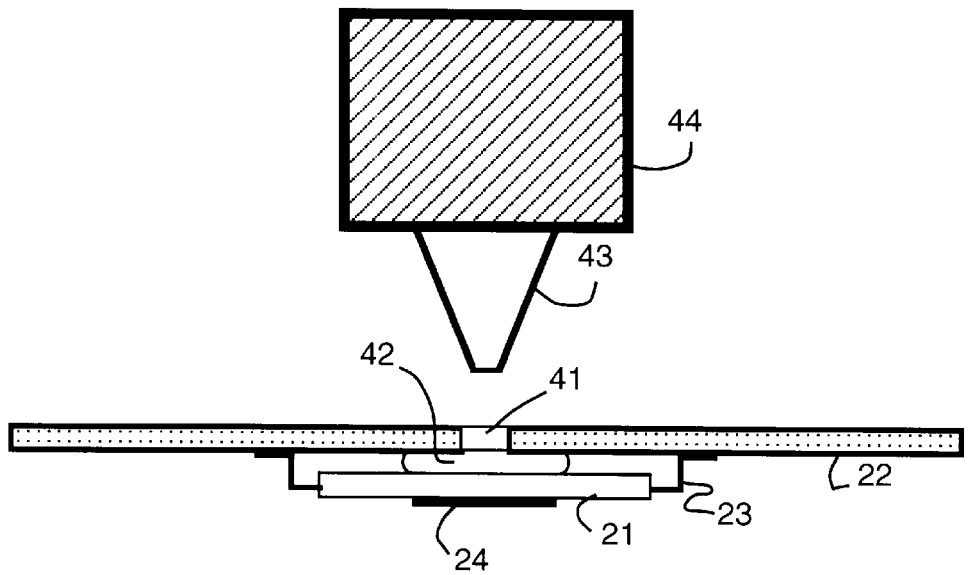
FIG. 4 illustrates a nozzle after injecting a quantity of thermoplastic adhesive.
Figure 5:
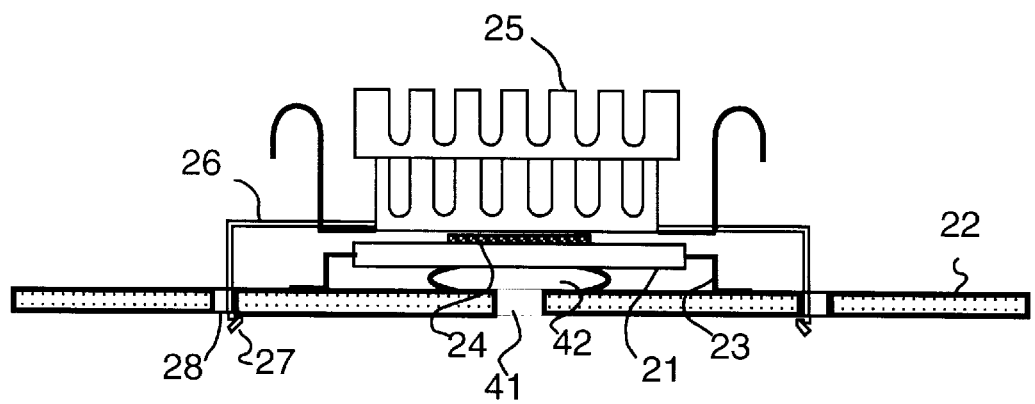
FIG. 5 illustrates an embodiment of the invention similar to FIG. 2 but including a support material.

The material can be applied using a variety of techniques. One preferred technique is to drill a hole in the circuit board, then securing the component, injecting a fluid material through the hole, and allowing the fluid material to set. Referring to FIG. 4, in one preferred implementation, hole 41 is drilled in printed circuit board 22 before leads 23 of package 21 (including die 24) are positioned on and soldered to PCB 22. The board can be inverted, then heated nozzle 43 (attached to heated delivery head 44) is positioned in hole 41. A valve mechanism is actuated to deliver a metered amount of material 42, then heated nozzle 43 is removed and the material is allowed to set. Comparing FIGS. 5 and 3, the material 42 is seen to provide support for package 21 and, consequently, die 24 during the process of attaching or handling heat sink 25.

The invention is directed to providing a support material that will be relatively rigid under operating conditions yet can be fluid under some process conditions to get the material into place. In general, a thermoplastic material is desired, although one skilled in the art will appreciate that it may be possible to use thermosetting or curing materials in certain applications. One useful category of thermoplastic materials are thermoplastic adhesives such as Jet-melt™ 3748 Adhesive or Jet-melt™ 3748 V-O Self Extinguishing Hot Melt Adhesive from 3M (St. Paul, Minn.). These polyolefin materials are relatively rigid (viscosity greater than several thousand, preferably substantially greater than 10,000 centipoise) at end-use operating temperatures (preferably less than 100° C.), yet relatively fluid (viscosity of 1,000–2,000 cps or less) at elevated temperature (process temperatures as high as needed, limited by the material). The viscosity of these materials increases considerably below the temperatures in Table 1 (50,000 cps or more at temperatures much below 160° C.).

TABLE I

| Temp. | 3748 | 3748 V-O |
|---|---|---|
| 160° C. (320° F.) | 12,500 | |
| 180° C. (356° F.) | 6,500 | 8,500 |
| 190° C. (374° F.) | 5,000 | |
| 200° C. (392° F.) | 4,000 | 5,000 |
| 220° C. (428° F.) | | 3,300 |

The preferred materials described above are adhesives. However, the primary benefit for this application is realized because they are thermoplastic materials, since they can be heated and manipulated in a liquid state. One skilled in the art will recognize other thermoplastic materials that would be suitable for this or similar applications.

When injected into the space under the component, the material will fill the available space and expand out under the component. The coefficient of thermal expansion is relatively low, so as the material cools it still substantially fills the space under the component. If the component needs to be removed from the board, use of a conventional rework tool to reflow the solder to unsolder the leads will generally heat the thermoplastic material sufficiently to soften it and allow the component to be pulled away from the board.

Referring to FIGS. 6 and 7, one preferred method of positioning a delivery nozzle is to secure it to a flexible bar that can be moved into position over and inserted into the hole, but returns to a resting position with clearance for the PCB to move along a conveyor after injecting the material. In one preferred embodiment, clamp 75 is secured relative to a conveyor belt frame (not shown). Vertical bar 74, preferably about two feet high, is connected to horizontal bar 73, which preferably is about 3 feet long. Heated hose 71 is connected to heated delivery head 44 and heated nozzle 43. Heated delivery head 44 is secured by clamp 72 to horizontal bar 73. Clamp 72 is insulated from heated delivery head 44 to minimize heat transfer to horizontal bar 73. An operator can hold the end of horizontal bar 73 and push downward to move heated nozzle 43 into position over a hole in a PCB on a conveyor (not shown). The positions of various component can be adjusted so a PCB on the conveyor can easily move under the nozzle, yet an operator can readily move the nozzle into place. A control mechanism (not shown) activates heated delivery head 44 to deliver a metered amount of material through heated hose 71.

Referring to FIG. 8, a second preferred delivery system is mounted to frame 86 which can be connected to a conveyor system. Hotmelt system 87 maintains a reservoir of material at a suitable temperature and feeds material into heated hose 81 to heated delivery head 84 and nozzle 83. A pneumatic press moves heated delivery head 84 up and down by a selected amount. This can be combined with a position sensor and manipulators as needed to position a PCB, lower nozzle 83 into contact with an appropriate hole, and automatically deliver a metered amount of material before rising out of the way to let the PCB move down the conveyor.

One preferred hotmelt system is the Slautterback Little Squirt™ Hotmelt System. Slautterback (Sand City, Calif.) provides a variety of heated supply hoses, including automatic HC, HS and OP hoses. Two useful heated delivery heads are the Slautterback E100 and E100XT Extrusion Applicators.

Some typical operating capacities and conditions are:

Slautterback Hot Melt System:

Tank Capacity: 10 lbs

Melt Rate: approximately 8 lbs/hr

Pump pressure range: 0–450 p.s.i. (0–3103 kPa)

0.32" ID heated hose maximum pressure: 2,500 p.s.i.

0.32" ID heated hose minimum bend radius: 8"

Operating Temperature range: 100 to 450 F. (37 to 232 C.)

Maximum hose viscosity: 70,000 cps

Maximum viscosity applicator head: 25,000 cps

Adhesive operating pressure for applicator head: 50–500 p.s.i.

Maximum cycle rate/minute for continuos firing: 600 cpm

Minimum pattern length: 50 ms +/–15 ms

Pattern registration accuracy: +/–15 ms

Figure 9:
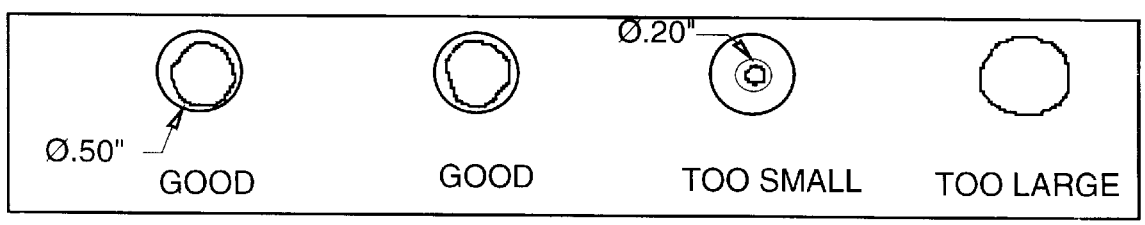
FIG. 9 illustrates a simple calibration technique for monitoring the delivery volume through the injection system.

In one preferred mode of operation, the hotmelt tank is maintained at about 310–320° F. and the hose and nozzle are maintained at about 375° F. Under these conditions, Jetmelt™ 3748 has a viscosity of approximately 5,000 cps. Delivery is metered for delivery times of approximately 0.1 to 0.35 seconds. One way of calibrating the delivered amount is to deliver between about 0.15 and 0.35 grams for a PowerPC 601 or PowerPC 604 processor. Another preferred method of calibrating the delivery amount is to apply a standard injection quantity onto a target that is readily visible. Referring to FIG. 9, a target of two concentric circles (which can be patterned to facilitate easy recognition of the inner and outer limits) is printed on a suitable material, such as paper. In one preferred target, the inner circle has a diameter of about 0.20 inches and the outer circle has a diameter of about 0.50 inches. If the operator brings the delivery nozzle close to the paper and delivers a standard amount, the quantity can be estimated from how it fills the target. The proximity of the nozzle to the paper can be readily adjusted to allow the material to flow smoothly onto the target. Preferably the material will form a generally smooth drop with the tip of the nozzle approximately at the top of a well-formed drop on the target. One skilled in the art can modify the operating parameters to deliver a desired amount of material for a selected component under selected conditions.

A general description of the device and method of using the present invention as well as a preferred embodiment of the present invention has been set forth above. One skilled in the art will recognize and be able to practice many changes in many aspects of the device and method described above, including variations which fall within the teachings of this invention. The spirit and scope of the invention should be limited only as set forth in the claims which follow.

What is claimed is:

1. A component support method for supporting a component on a substrate, said method comprising providing a substrate, securing a component on said substrate, said component including a first portion in contact with said substrate and a second portion positioned some distance above said substrate, providing a support material positioned between said substrate and said second portion of said component positioned some distance above said substrate, and injecting said support material between said component and said support, whereby said component is supported above said substrate.

2. A component support method for supporting a component on a substrate, said method comprising providing a substrate, securing a component on said substrate, said component including a first portion in contact with said substrate and a second portion positioned some distance above said substrate, providing a support material positioned between said substrate and said second portion of said component positioned some distance above said substrate, providing a hole in said substrate below said component, and injecting said support material through said hole, whereby said component is supported above said substrate.

3. The component support method of claim 2 further comprising heating said support material to a first selected temperature and injecting said support material at a second selected temperature.

* * * * *